US008685279B2

(12) United States Patent
Emoto et al.

(10) Patent No.: US 8,685,279 B2
(45) Date of Patent: Apr. 1, 2014

(54) SIALON PHOSPHOR, PROCESS FOR PRODUCING THE SAME, AND ILLUMINATOR AND LUMINESCENT ELEMENT EMPLOYING THE SAME

(71) Applicants: Hideyuki Emoto, Tokyo (JP); Masahiro Ibukiyama, Tokyo (JP); Takashi Kawasaki, Tokyo (JP)

(72) Inventors: Hideyuki Emoto, Tokyo (JP); Masahiro Ibukiyama, Tokyo (JP); Takashi Kawasaki, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/791,762

(22) Filed: Mar. 8, 2013

(65) Prior Publication Data

US 2013/0193600 A1 Aug. 1, 2013

Related U.S. Application Data

(62) Division of application No. 13/464,855, filed on May 4, 2012, now abandoned, which is a division of application No. 12/300,127, filed as application No. PCT/JP2007/059527 on May 8, 2007, now abandoned.

(30) Foreign Application Priority Data

May 10, 2006 (JP) .................................. 2006-131018
Jun. 19, 2006 (JP) .................................. 2006-168759

(51) Int. Cl.
*C09K 11/08* (2006.01)
*C09K 11/66* (2006.01)

(52) U.S. Cl.
USPC .................................................. 252/301.4 F

(58) Field of Classification Search
USPC .................... 252/301.4 F, 301.6 F, 301.4 R
See application file for complete search history.

(56) References Cited

U.S. PATENT DOCUMENTS

| 5,096,864 | A * | 3/1992 | Yeckley ........................ 501/98.1 |
| 2005/0001225 | A1 | 1/2005 | Yoshimura et al. |
| 2005/0020432 | A1 | 1/2005 | Roy et al. |
| 2005/0116244 | A1 | 6/2005 | Sakata et al. |
| 2006/0033083 | A1 | 2/2006 | Sakane et al. |
| 2007/0108896 | A1 | 5/2007 | Hirosaki |
| 2007/0248519 | A1 | 10/2007 | Mitomo et al. |
| 2008/0064586 | A1 | 3/2008 | Mitomo et al. |
| 2010/0237767 | A1 | 9/2010 | Emoto et al. |
| 2012/0228551 | A1 | 9/2012 | Emoto et al. |

FOREIGN PATENT DOCUMENTS

| EP | 1 854 864 A1 | 11/2007 |
| JP | H1-264972 A | 10/1989 |
| JP | H05-152609 A | 6/1993 |
| JP | H06-9956 A | 1/1994 |
| JP | H07-099345 A | 4/1995 |
| JP | 2002-194347 A | 7/2002 |
| JP | 2003-124527 A | 4/2003 |
| JP | 2003-206481 A | 7/2003 |
| JP | 2003-253260 A | 9/2003 |
| JP | 2003-336059 A | 11/2003 |
| JP | 2004-186278 A | 7/2004 |
| JP | 2004-238505 A | 8/2004 |
| JP | 2004-244560 A | 9/2004 |
| JP | 2004-277663 A | 10/2004 |
| JP | 2005-97011 A | 4/2005 |
| JP | 2005-105177 A | 4/2005 |
| JP | 3668770 B2 | 4/2005 |
| JP | 2005-255895 A | 9/2005 |
| JP | 2006-52337 A | 2/2006 |
| JP | 2006-63323 A | 3/2006 |
| JP | 2006348139 A * | 12/2006 |
| JP | 2008-45271 A | 2/2008 |
| WO | 2005/123876 A1 | 12/2005 |
| WO | 2006/011317 A1 | 2/2006 |
| WO | 2006/011542 A1 | 2/2006 |
| WO | WO 2007018260 A1 * | 2/2007 |

OTHER PUBLICATIONS

Machine translation of JP2006348139A.*
International Search Report (ISR) issued in PCT/JP2007/059527 mailed in Aug. 2007. (U.S. Appl. No. 13/464,855.).
PCT/ISA/237 issued in PCT/JP2007/059527 and its English translation of Section V. (U.S. Appl. No. 13/464,855.), mailed Aug. 2007.
J.W.H Van Krebel, "On New Rare-Earth Doped M—Si—Al—O—N Materials", TU Eindhoven, The Netherlands, pp. 145-161, 1998 (U.S. Appl. No. 13/464,855.).
Dai 52 kai Ouyou Butsurigaku Kankei Rengou Kouenkai Kouen Yokousyu, Mar. 2005, Saitama University, pp. 1614-1615 (U.S. Appl. No. 13/464,855 as a concise explanation of relevance.).

(Continued)

*Primary Examiner* — Emily Le
*Assistant Examiner* — Lynne Edmondson
(74) *Attorney, Agent, or Firm* — Chen Yoshimura LLP

(57) ABSTRACT

Phosphor that can provide white LED that uses a blue LED or an ultraviolet LED as a light source and that has superior luminous efficiency. This phosphor includes, as a main component, α-type sialon represented by a general expression: $(M1)_x(M2)_y(Si,Al)_{12}(O,N)_{16}$ (where M1 is one or more types of elements selected from a group consisting of Li, Mg, Ca, Y, and lanthanide element (except for La and Ce) and M2 is one or more types of elements selected from a group consisting of Ce, Pr, Eu, Tb, Yb, and Er, and $0.3 \leq X+Y \leq 1.5$ and $0 < y \leq 0.7$ are established and the sialon phosphor consists of a powder having a specific surface area of 0.2 to 0.5 m²/g.

4 Claims, No Drawings

(56) References Cited

OTHER PUBLICATIONS

Dai 65 kai Ouyou Butsurigakkai Gakujyutsu Kouenkai Kouen Yokousyu, Sep. 2004, Tohoku Gakuin University, No. 3, pp. 1282-1284 (U.S. Appl. No. 13/464,855 as a concise explanation of relevance.).

Mitomo et al., "Preparation of α-SiAlON Powders by Carbothermal Reduction and Nitridation", Ceramics International 14, pp. 43-48, 1998 (U.S. Appl. No. 13/464,855.).

Van Rutten et al., "Carbothermal Preparation and Characterisation of Ca-α-sialon", Journal of the European Ceramic Society, 15, pp. 599-604, 1995 (U.S. Appl. No. 13/464,855.).

Komeya et al., "Hollow Beads Composed of Nanosize Caα-SiAlON Grains", J. Am. Ceram. Soc., vol. 83, No. 4, pp. 995-997, Apr. 2000 (U.S. Appl. No. 13/464,855.).

PCT/IPEA/408 issued in PCT/JP2007/059527 and its English translation of Section V. (U.S. Appl. No. 13/464,855.), mailed Jul. 2008.

PCT/IPEA/409 issued in PCT/JP2007/059527 and IB338. (U.S. Appl. No. 13/464,855.), mailed Jul. 2008.

Xie et al., "Photoluminescence of Cerium-Doped α-SiAlON Materials", J. Am. Ceram. Soc., Jul. 2004, vol. 87, No. 7, pp. 1368-1370 (U.S. Appl. No. 13/464,855.).

European Search Report dated Sep. 6, 2011, in the counterpart European patent application No. 07742962.9. (U.S. Appl. No. 13/464,855.).

\* cited by examiner

SIALON PHOSPHOR, PROCESS FOR PRODUCING THE SAME, AND ILLUMINATOR AND LUMINESCENT ELEMENT EMPLOYING THE SAME

This application is a divisional of a application, U.S. Ser. No. 13/464,855 filed on May 4, 2012 now abandoned, which is a divisional application of U.S. Ser. No. 12/300,127 filed on Nov. 10, 2008, now abandoned, which is the National Stage Application of PCT International Application No. PCT/JP2007/059527, filed May 8, 2007 all of which are hereby incorporated by reference in their entireties.

TECHNICAL FIELD

The present invention relates to sialon phosphor excited by ultraviolet light or blue light to emit visible light and the manufacture method thereof as well as an illuminator and a luminescent element using the same. In particular, the present invention relates to phosphor that can be used for a blue light-emitting diode (blue LED) or an ultraviolet light-emitting diode (ultraviolet LED) and the manufacture method thereof as well as an illuminator and a luminescent element using the same, in particular, a white light-emitting diode (white LED).

TECHNICAL BACKGROUND

Phosphor is well-known that uses silicate, phosphate, aluminate, and sulfide as host material and that uses transition metal or rare-earth metal for the luminescent center.

On the other hand, such white LED has attracted attention that is excited by an excitation source having high energy (e.g., ultraviolet light or blue light) to emit visible light and has been developed. However, when the above-described conventional phosphor is used, the exposure to the excitation source disadvantageously causes a decreased phosphor luminance.

As phosphor having a small decrease in the luminance, nitride or oxynitride phosphor has attracted attention recently as material that has a stable crystal structure and that can shift the excitation light and the light emission toward the long wavelength.

As nitride and oxynitride phosphor, α-type sialon (Si—Al—O—N) for which a specific rare-earth element is activated has been known as having a useful fluorescence characteristic and has been examined for the use to white LED or the like (see Patent Documents 1 to 5 and Non-Patent Documents 1 and 2).

The α-type sialon has a structure in which the Si—N bonds of α-type silicon nitride crystal is partially substituted with Al—N bonds and Al—O bonds and electroneutrality is maintained by a specific element (Ca, Li, Mg, and Y or lanthanide metal except for La and Ce) interstitially solid-soluted to a crystal lattice. A part of the interstitially solid-soluted element is a rare-earth element functioning as the luminescent center to cause the fluorescence characteristic.

The α-type sialon is obtained by burning mixed powders consisting of silicon nitride, aluminum nitride, optionally aluminum oxide, and the oxide of an interstitially solid-soluted element or the like in nitrogen at a high temperature. The proportion between silicon nitride and aluminum compound, the type of an interstitially solid-soluted element, and the ratio of an element functioning as the luminescent center for example can provide various fluorescence characteristics. In particular, α-type sialon, which is obtained by solid-soluting Ca functioning as an interstitially solid-soluted element and Eu functioning as the luminescent center, is efficiently excited in a wide wavelength range from a ultraviolet region to a blue region and emits light in a range from yellow to orange. Thus, the development of a combination of this α-type sialon with an LED emitting blue light (which is a complementary color to yellow to orange) has been expected for white LED.

$Ca_2(Si, Al)_5N_8$, $CaSiAlN_3$ or β-type sialon obtained by activating a rare-earth element also has been found to have the similar fluorescence characteristic (see Patent Documents 6 and 7 and Non-Patent Documents 2 and 3).

In addition, nitrides (e.g., aluminum nitride, silicon nitride magnesium, silicon nitride calcium, silicon nitride barium, gallium nitride, silicon nitride zinc) and oxynitride phosphor (hereinafter also referred to as nitride phosphor and oxynitride phosphor in this order) have been suggested.

In the case of the α-type sialon powders for example, the reduction-nitridation method has been known as a synthesis method of these phosphors. According to the reduction-nitridation method, mixed powders of aluminum oxide ($Al_2O_3$), silicon oxide ($SiO_2$), oxide of metal or element that can be solid-soluted into the lattice or the like is subjected to a heating processing in nitrogen atmosphere under the existence of carbon (see Non-Patent Documents 4 to 6).

Although the methods reported in Non-Patent Documents 4 to 6 are characterized in that raw material powders are low-cost and can be synthesized at a relatively low temperature of about 1500 degrees C., a plurality of intermediates are caused in the synthesis and gas components such as SiO and CO are generated to difficultly provide the single-phase one, causing a difficulty in the strict control of the composition and the control of the particle size.

Sialon powders are also obtained by burning the mixture of silicon nitride, aluminum nitride, and the oxide of metal or an element or the like solid-soluted into the lattice at a high temperature to grind the resultant sintered compact. However, this has caused a problem of a decreased light emission intensity of phosphor due to a grinding operation.

As described above, in the conventional technique, nitride including a constituting element and a compound including an activating element are merely mixed and heated or the mixture of oxides of the constituting elements is merely subjected to reduction-nitridation by carbon or the like. This conventional technique cannot provide nitride phosphor or oxynitride phosphor having a sufficient characteristic.

In the case of sialon phosphor in particular, when a manufacture method is used in which oxides including the constituting elements of solid-soluted elements (e.g., calcium or yttrium) or the activating element (e.g., cerium, europium) are used as raw material, a burning process causes a liquid-phase sintering to cause a stronger binding among particles. This has caused a case where a grind processing under severe conditions may be required in order to obtain powders having a target particle size. In this case, the grind processing under severe conditions cause an increase in the contamination and introduce defects into the surfaces of the respective particles, thereby disadvantageously causing a deteriorated light emission characteristic.

In order to solve this problem, the present inventors have suggested a manufacture method rarely requiring a grind processing by using raw material not including oxygen (e.g., raw material such as calcium fluoride or calcium cyanamide) and by devising a method for mixing raw materials for a burning process for example. Thus, the present inventors could improve the light emission intensity (see Patent Documents 8 and 9).

In order to realize white, a combination of a plurality of colors different from a monochromatic light is required. A general white LED is composed of a combination of ultraviolet LED or blue LED and phosphor that uses the light from the LED as an excitation source and that emits visible light (see Patent Documents 10 and 11 for example). Thus, in order to improve the white LED efficiency, it is required to improve the luminous efficiency of the ultraviolet LED or the blue LED itself and to improve the efficiency of phosphor in the LED. It is also required to improve an efficiency at which emitted light is taken out to the outside. In order to increase use of white LED including a general lighting use, all of these efficiencies must be improved.

Patent Document 1: Japanese Patent No. 3668770
Patent Document 2: Japanese Patent No. 2003-336059 A
Patent Document 3: Japanese Patent No. 2003-124527 A
Patent Document 4: Japanese Patent No. 2003-206481 A
Patent Document 5: Japanese Patent No. 2004-186278 A
Patent Document 6: Japanese Patent No. 2004-244560 A
Patent Document 7: Japanese Patent No. 2005-255895 A
Patent Document 8: Japanese Patent No. 2008-45271 A
Patent Document 9: Published Japanese translation of a PCT application No. 2005-123876
Patent Document 10: Japanese Patent No. H5-152609 A
Patent Document 11: Japanese Patent No. H7-099345 A
Non-Patent Document 1: J. W. H van Krebel "On New Rare-Earth Doped M—Si—Al—O—N Materials", T U Eindhoven, The Netherlands, 145-161 (1998)
Non-Patent Document 2: Dai 52 kai Ouyou Butsurigaku Kankei Rengou Kouenkai Kouen Yokousyu (March 2005, Saitama University) P. 1614-1615
Non-Patent Document 3: Dai 65 kai Ouyou Butsurigakkai Gakujyutsu Kouenkai Kouen Yokousyu (September 2004, TOHOKU GAKUIN UNIVERSITY) No. 3, p. 1282-1284
Non-Patent Document 4: M. Mitomo et al., "Preparation of α-SiAlON Powders by Carbothermal Reduction and Nitridation" (Ceram. Int., 14, 43-48 (1988))
Non-Patent Document 5: J. W. T. van Rutten et al., "Carbothermal Preparation and Characterization of Ca-α-SiAlON" (J. Eur. Ceram. Soc., 15, 599-604 (1995))
Non-Patent Document 6: K. Komeya et al., "Hollow Beads Composed of Nanosize Ca α-SiAlON Grains" (J. Am. Ceram. Soc., 83, 995-997 (2000))

DISCLOSURE OF THE INVENTION

Problem to be Solved by the Invention

White LED phosphor is generally obtained by dispersing micron size particles in sealing material such as epoxy resin or silicone resin. In the case of α-type sialon phosphor, the particles are the secondary particles obtained by sintering a plurality of minute primary particles. Although the size and the distribution or the like have been examined, no attention has been paid on the surface texture of the secondary particles.

However, even the devising as disclosed in Patent Documents 8 and 9 only provides the resultant phosphor particles consisting of the secondary particles to which the primary particles having a diameter of about 0.2 to 5 μm are fixed in an irregular manner. This has caused a case where the secondary particles having a complicated surface due to significant concavities and convexes or the interface among the primary particles in the secondary particles has light scattering or absorption, causing the phosphor to have a decreased luminous efficiency.

Furthermore, general raw material powders such as silicon nitride or aluminum nitride have an average diameter of 1 μm or less. When these raw material powders are used as raw material for a conventional method to synthesize nitride or oxynitride phosphor, the resultant fine particles inevitably have a wide particle size distribution. Since the resultant fine particles particularly have a diameter of a few μm or less that strongly scatter the visible light, a problem of a decreased luminous efficiency has been caused.

On the other hand, white LED obtained so far has a lower luminous efficiency than a fluorescence lamp. Thus, LED having a superior luminous efficiency, especially white LED in particular, than a fluorescence lamp has been strongly demanded from the viewpoint of energy conservation in the industry field. Although white LED using oxynitride or nitride phosphor such as sialon phosphor has a higher efficiency than an incandescent lamp, increased applications of the LED including general lighting applications require a further improvement in the luminous efficiency. Thus, an improved luminous efficiency of phosphor has been an important task for the industry field.

In view of the above problems, through various examinations of α-type sialon phosphor, it is the first objective of the present invention to provide a white LED, in particular, a white LED using blue LED or ultraviolet LED as a light source having a superior luminous efficiency that has a peak in a wavelength range from 540 to 600 nm and that has a superior luminous efficiency.

It is the second objective of the present invention to solve the above problem of the conventional technique to provide an LED having a superior luminous efficiency (e.g., a white LED, in particular, a white LED using blue LED or ultraviolet LED as a light source) as well as phosphor having a superior fluorescence characteristic suitable for the LED to the industry field.

Means for Solving Problem

The inventors have examined the phosphor composed of α-type sialon as host material. The inventors have reached the present invention by finding that a specific interstitially solid-soluted element of the α-type sialon can be used to set the crystal lattice size within an appropriate range to provide the flat and smooth surface of the secondary particles. This provides phosphor having a peak in wavelengths in a range from 540 to 600 nm and having superior luminous efficiency. This can be used to provide an illuminator having a superior light emission characteristic.

Furthermore, the present inventors have reached the present invention by finding that the addition of a seed particle as a core of the grain growth into a raw material powder and the use of a dense boron nitride crucible in a synthesis process can improve the flat and smooth surface of the secondary particles.

In order to achieve the first objective, the sialon phosphor of the present invention is characterized in sialon phosphor that includes, as a main component, α-type sialon represented by a general expression: $(M1)_x(M2)_y(Si,Al)_{12}(O,N)_{16}$ [wherein M1 is one or more types of elements selected from a group consisting of Li, Mg, Ca, Y, and lanthanide element (whreas except for La and Ce) and M2 is one or more types of elements selected from a group consisting of Ce, Pr, Eu, Tb, Yb, and Er, and $0.3 \leq X+Y \leq 1.5$ and $0 < Y \leq 0.7$ are established], and the sialon phosphor is a powder having a specific surface area of 0.2 to 0.5 $m^2/g$. The above configuration is characterized in that the α-type sialon phosphor has a lattice constant a in a range from 0.780 to 0.788 nm and a lattice constant c in a range from 0.565 to 0.573 nm.

The above configuration is characterized in that, when powders consisting of the α-type sialon are evaluated based on an X-ray diffraction method, crystal phases other than that of the α-type sialon preferably have diffraction intensities that are all 10% or less to a diffraction line intensity of a face(102) of the α-type sialon.

The above configuration is characterized in that the M1 includes at least Ca, the M2 includes at least Eu and $0<Y\leq0.1$ is established and, when ultraviolet light or visible light having wavelengths in a range from 250 to 500 nm is emitted as an excitation source to the sialon phosphor, the sialon phosphor shows a light emission characteristic having a peak in a wavelength range from 540 to 600 nm.

The method of manufacturing α-type sialon phosphor of the present invention represented by the above general expression is characterized in that starting raw material includes α-type sialon in an amount of 5 to 30 mass %. In the above configuration, the starting raw material preferably includes the α-type sialon having a specific surface area in a range from 0.5 to 2 $m^2/g$.

Another method of manufacturing the above-described sialon phosphor of the present invention is characterized in that the starting raw material is filled in a boron nitride-made crucible having a density of 1.75 $g/cm^3$ or more and is burned in nitride atmosphere. The crucible preferably consists of pyrolytic boron nitride (P-BN).

An illuminator of the present invention is characterized in being composed of a light source and phosphor and uses sialon phosphor which is at least the above mentioned sialon phosphor or sialon phosphor obtained by the above-mentioned manufacture method.

In order to allow phosphor consisting of sialon (hereinafter simply referred to as sialon phosphor) to have an improved light emission intensity, the inventors have subjected various particles to an analysis regarding the characteristics and compositions thereof. Through an experimental examination, the inventors have found that the control of the particle shape, diameter, composition distribution or the like of the phosphor particles is effective to improve the light emission intensity, thereby reaching the present invention.

In order to achieve the above second objective, the second sialon phosphor of the present invention is characterized in that particles constituting the phosphor has an average circularity degree of 0.75 or more, the phosphor has a particle size distribution $D_{50}$ of 5 to 30 μm and $D_{10}$ of 2.0 μm or more.

Another configuration of the sialon phosphor of the present invention is characterized in that the phosphor is composed of particles including light emission-related elements that have a low concentration in the interior of the particle and that have a high concentration at the outer periphery of the particle. In this configuration, the light emission-related element at the outer periphery of the phosphor particle preferably has a concentration 1.2 times or more higher than that of the light emission-related element at the interior of the particle.

In the above configuration, the phosphor is preferably α-type sialon represented by a general expression: $(M1)_X(M2)_Y(Si)_{12-(m+n)}(Al)_{m+n}(O)_n(N)_{16-n}$ [wherein M1 is one or more types of elements selected from a group consisting of Li, Mg, Ca, Sr, Y, and lanthanide metal (whreas except for La and Ce) and M2 is one or more types of elements selected from Ce, Pr, Eu, Tb, Yb, and Er, and $0.3\leq X+Y\leq1.5$, $0<Y\leq0.7$, $0.6\leq m\leq3.0$, $0\leq n\leq2.5$, X+Y=m/(average valence of M1 and M2)]. Preferably, the M1 is Ca and the M2 is Eu.

A method of manufacturing α-type sialon phosphor of the present invention is characterized in including: a step of mixing silicon-containing material, aluminum-containing material, and raw material including M1 (one or more types of elements selected from a group consisting of Li, Mg, Ca, Sr, Y, and lanthanide metal (except for La and Ce)) and M2 (one or more types of elements selected from Ce, Pr, Eu, Tb, Yb, and Er) to prepare granulated powders; and a step of heating the powders in a nitrogen gas atmosphere at 1500 to 2100 degrees C. to obtain α-type sialon phosphor. Preferably, previously-synthesized α-type sialon phosphor is added to the raw material and mixed with the raw material.

A method of manufacturing β-type sialon phosphor of the present invention is characterized in including: a step of mixing silicon-containing material, aluminum-containing material, and raw material including M3 (one or more types of elements selected from Mn, Ce, and Eu) to prepare granulated powders; and a step of heating the above granulated powders in nitrogen gas atmosphere at a temperature from 1500 to 2100 degrees C. to obtain β-type sialon phosphor. Preferably, previously-synthesized β-type sialon phosphor is added to the raw material and mixed with the raw material.

A luminescent element of the present invention is characterized in including, as constituting elements, the above sialon phosphor and a light-emitting diode having the maximum intensity in light emission wavelengths in a range from 240 to 480 nm.

Effect of the Invention

The first sialon phosphor of the present invention has the large primary particles without changing the secondary particles size and provides particles having a flat and smooth surface in comparison with the conventional one. Thus, particles of the first sialon phosphor can efficiently absorb excitation light to provide a superior light emission characteristic. Furthermore, since the illuminator of the present invention uses the phosphor, a favorable light emission characteristic is obtained.

Since the second sialon phosphor of the present invention has specific particles shape and composition distribution, it has high light emission intensity and luminous efficiency even when the phosphor is individually measured. Furthermore, since the second sialon phosphor is well dispersed in sealing resin, an LED element sealed by the second sialon phosphor is suppressed from causing unnecessary light scattering or light absorption in the sealing resin layer and thus has an improved luminous efficiency.

Since the sialon phosphor of the present invention has the above-mentioned characteristics, it can be preferably used for various LEDs. The sialon phosphor of the present invention can be combined with an LED having the maximum intensity in light emission wavelengths in a range from 240 to 480 nm in particular to provide a white LED.

According to the method for manufacturing the sialon phosphor of the present invention, the phosphor having the above characteristics can be stably provided in a large amount.

THE BEST MODE FOR CARRYING OUT THE CLAIMED INVENTION

The following section will explain the present invention in detail. First, sialon phosphor according to the first embodiment of the present invention will be described.

The α-type sialon has a structure in which the Si—N bonds in the α-type silicon nitride is partially substituted with Al—N bonds and Al—O bonds and electroneutrality is maintained by a specific positive ion ingressed and solid-soluted to the lattice. The α-type sialon is represented by a general expression of $M_z(Si,Al)_{12}(O,N)_{16}$. In the expression, M represents an element that can be ingressed into the lattice and that is Li, Mg, Ca, Y, and lanthanide metal (except for La and Ce). The solid-solution amount value Z of M is a numeric value determined by a substitutional rate of the Al—N bonds for Si—N bonds.

In order to arise the fluorescence characteristic, a part of M must be an element that can be solid-soluted and that can function as the luminescent center. In order to obtain phosphor emitting visible light, Ce, Pr, Eu, Tb, Yb, and Er are preferably used. Assuming that an element that is among those interstitially solid-soluted into the lattice and that does not contribute to the light emission is M1 and an element functioning as the luminescent center is M2, the general expression can be represented as $(M1)_x(M2)_y(Si,Al)_{12}(O,N)_{16}$. In order to arise the fluorescence characteristic, the values X and Y are preferably within the range of $0.3 \leq X+Y \leq 1.5$ and $0 < Y \leq 0.7$.

The α-type sialon is generally obtained by heating mixed powders consisting of silicon nitride, aluminum nitride, aluminum oxide, and an interstitially solid-soluted element in a nitrogen atmosphere at a high temperature to cause the reaction. In a temperature rising process, a part of the constituting components forms a liquid phase through which substances move, thereby generating the α-type sialon solid solution. Thus, the synthesized α-type sialon has a structure in which the plurality of primary particles are sintered to form the secondary particles and thus a lump-shaped body. Thus, the lump-shaped body may be ground for example to form a powder-like formation.

The inventors have reached the present invention based on a finding that the specific surface area of the particles is closely connected to the light emission characteristic as a result of the examination of the relation between the light emission characteristic and the particle property. The specific surface area of particles shows how the particles are flat and smooth and is a sensitive for fine particle.

Specifically, the phosphor of the present invention preferably has, in addition to the composition, the specific surface area of the phosphor powders in a range from 0.2 to 0.5 m²/g. The specific surface area exceeding 0.5 m²/g causes the light scattering by the particle surface and fine particles to deteriorate the efficiency at which the excitation light is taken into the particles to deteriorate the light emission characteristic, which is not preferred. The specific surface area smaller than 0.2 m²/g is difficultly obtained by isolated primary particles and requires densely-sintered particles. Thus, the specific surface area smaller than 0.2 m²/g inevitably causes very large secondary particles that are deviated from a preferred size of phosphor such as LED and thus is not preferred.

Furthermore, the phosphor of the present invention includes the α-type sialon as a main component and is structured so that the particle interface has an intergranular phase having a different composition and, the crystalline or amorphous secondary phase is easily formed. Thus, entire composition of the phosphor powders does not always correspond to the solid-solution composition of the α-type sialon. In the case of the α-type sialon crystal, an increase in the solid-solution amount of aluminum and oxygen causes an increase in the crystal lattice size. Thus, attention was paid on the lattice constant of the α-type sialon and was examined. The result showed that a favorable light emission characteristic was obtained in the case the lattice constant a was in a range from 0.780 to 0.788 nm and a lattice constant c was in a range from 0.565 to 0.573 nm.

In the present invention, it is desirable that the highly pure α-type sialon crystal phase is maximally included, especially composed of the single-phase if possible, in the phosphor of the present invention from the viewpoint of the fluorescence emission. However, the phosphor of the present invention also may be made of a mixture including a slight amount of indispensable amorphous phase and other crystal phases so long as the characteristic is not deteriorated. According to the result of the examination by the present inventors, preferred phosphor shows, when being evaluated by the powder X-ray diffractometry, the diffraction intensity of the crystal phase other than that of the α-type sialon is 10% or less of the diffraction intensity of the face (102) of the α-type sialon. An existence of a crystal phase having the diffraction intensity exceeding 10% causes a deteriorated light emission characteristic.

When M1 of Ca and M2 of Eu are selected as elements solid-soluted into the crystal lattice of the α-type sialon, ultraviolet light or visible light having a wavelength in a range from 250 to 500 nm can be emitted as an excitation source to the phosphor to provide the phosphor that has a peak in a wavelength range from 540 to 600 nm and that shows light emission from yellow to orange. This phosphor is preferred because this phosphor can provide an illuminator emitting white light such as a white LED by the use of a blue LED as an excitation source for example to provide mixed light of yellow light emitted from the phosphor and the excitation light.

With regards to elements solid-soluted into the crystal lattice of α-type sialon, the atomic weight ratio of Eu functioning as the luminescent center is preferably within a range of $0 < Y \leq 0.1$. The value Y exceeding 0.1 causes an interference among solid-soluted Eu ions to cause concentration quenching, thus causing a deteriorated light emission luminance.

As a method for obtaining the sialon phosphor of the present invention, a method of synthesizing the α-type sialon in which Ca and Eu are solid-soluted will be described hereinafter.

Powders of silicon nitride, aluminum nitride, calcium-containing compound, and europium oxide are used as raw material. The method of manufacturing the phosphor of the present invention is characterized in that the mixture of the raw material powders so as to achieve a predetermined composition is caused to include previously-synthesized α-type sialon powders of 5 to 30 mass %.

The α-type sialon powders previously blended in the raw material powders are selectively caused to function as a particle formation origin during a heating processing to promote the growth of the primary particles to cause coarsened primary particles and a flatter and smoother surface. When the α-type sialon powders are previously added to the raw material powders, an effect is provided to suppress the sintering in the synthesis process, thus realizing the generation of sialon that is easily pulverized. This sialon does not require an excessive grinding, can provide powders having a desired particle size by an easy deagglomeration processing, and can suppress the generation of fine particles due to a grind processing that deteriorates the light emission characteristic.

An additive amount of the α-type sialon powders of 5 mass % or more can provide powders having a small specific surface area without causing the promotion of the nucleation, sintering, and grain growth of new α-type sialon particles at a part other than the added α-type sialon particles. An additive amount of the α-type sialon powders of 30 mass % or less does not cause too many grain growth origins which reduce the growth of individual particles. This can prevent a difficulty in obtaining a sufficiently flat and smooth particle surface, which is preferable.

The constituting elements and composition of the α-type sialon powders previously included in the raw material are not limited. The reason is the excitation of ultraviolet light to blue light causes the fluorescence characteristic to be arised mainly at a region close to the powder surface. However, the use of the α-type sialon powders including a different luminescent center element or including an impurity element, e.g., iron, that inhibits the light emission has a significant influence on the characteristic of the α-type sialon phosphor layer formed on the surface and thus is not preferred.

In the present invention, the α-type sialon powders previously added preferably has a specific surface area of 0.5 to 2 $m^2/g$. The specific surface area of 2 $m^2/g$ or less sufficiently achieves the effect to the grain growth. On the other hand, the specific surface area of 0.5 $m^2/g$ or more does not cause a remarkably-large diameter of the secondary particles of the synthesis powders and consequently require no grind processing for example to easily achieve the target specific surface area of 0.2 to 0.5 $m^2/g$, which is preferred.

The method for mixing the respective raw materials including the above-described α-type sialon may be a dry blending method or a method for carrying out a wet blending in inactive solvent substantially not reacting with the respective components of the raw material to subsequently remove the solvent for example. Preferred mixing apparatuses include a V-type mixing machine, a rocking mixer, a ball mill, a vibrational mill or the like.

Powders obtained by being mixed to achieve a desired composition (hereinafter referred to as raw material powders) are filled in a container such as a crucible in which at least a face having a contact with the raw material powders is made of boron nitride. Then, the powders are heated in a nitrogen atmosphere in a temperature range from 1600 to 1800 degrees C. for a predetermined time to obtain α-type sialon. The reason why boron nitride is used for the material of the container is that boron nitride has a very low reactivity to the respective components of the raw material. The inventors have found that an increased density of boron nitride used to constitute the crucible advantageously increases the primary particles as in a case where the α-type sialon powders are added to the raw material powders to allow the surface to be flat and smooth.

The boron nitride ceramics to use as the crucible preferably has a density of 1.75 $g/cm^3$ or more. The density of 1.75 $g/cm^3$ or less easily causes gas permeation in the crucible to promote the volatilization of the components included in the raw material powders filled in the crucible. This not only causes a change in the composition but also causes carbon monoxide gas, cyan gas or the like existing in the furnace to enter the crucible to cause the reaction with the raw material powders and the inhibition of the grain growth, which is not preferred. Thus, the density of the crucible preferably maximized. Pyrolytic boron nitride (α-BN) manufactured by the gas phase method in particular is very dense and thus is preferably used.

The maximum bulk of the raw material powders is preferably filled in the container because it can suppress the interparticle sintering during heating. Specifically, in order to synthesize α-type sialon for phosphor efficiently, the bulk of the raw material powders are preferably filled in the synthesis container with a bulk density of 1.0 $g/cm^3$ or less.

The temperature in the heating processing of 1600 degrees C. or more prevents the existence of many unreacted products or an insufficient growth of the primary particles. The temperature in the heating processing of 1800 degrees C. or less prevents remarkable interparticle sintering.

A heating time for the heating processing may be selected within a range to prevent inconveniences such as the existence of many unreacted products, an insufficient growth of the primary particles, or an interparticle sintering. According to the examination by the present inventors, the heating time is preferably within a range from 2 to 24 hours.

Since the α-type sialon obtained by the above-described operation has a lump-shaped form, this α-type sialon may be subjected to a deagglomeration processing, a grinding processing, and optionally a classification processing to have a powder-like form having a predetermined size and can be used as powder-like phosphor applied to various uses.

In order to favorably use of the α-type sialon as white LED phosphor, the secondary particles may have an average diameter of 3 to 30 μm. The secondary particles having an average diameter of 3 μm or more prevents a decreased light emission intensity. The secondary particles having an average diameter of 30 μm or less allows the resultant α-type sialon to be uniformly dispersed into the resin for sealing LED and prevents variation in the light emission intensity and color tone and can be practically used.

The lump-shaped body consisting of the α-type sialon obtained by the above-described manufacture method has a relatively-high easy pulverizability and can be easily ground by a mortar or the like to have a predetermined particle size. However, this lump-shaped body also may be ground by general grinding machines such as a ball mill, a vibrational mill, or a jet mill.

The sialon phosphor of the present invention is favorably used for illuminator because the sialon phosphor has a wide excitation range from ultraviolet light to visible light and emits visible light. Phosphor obtained by selecting Ca and Eu as the interstitially element into the crystal lattice of the α-type sialon in particular can control to provide yellow to orange light having a peak wavelength in a range from 540 to 600 nm depending on and has a high luminance light emission characteristic depending on substitutional rate of the Si—N bonds to the Al—N bonds and Al—O bonds. Thus, this phosphor is characterized in that a combination of this phosphor with blue LED can easily provide white light. Furthermore, the α-type sialon is advantageous in that the α-type sialon does not deteriorate even when being subjected to a high temperature and has a superior heat resistance. Thus, the α-type sialon is advantageously stable under oxidation atmosphere and water environment for a long time.

The illuminator of the present invention is composed at least of; a light-emitting light source; and the phosphor of the present invention. The illuminator of the present invention includes a LED illuminator, a fluorescence lamp or the like. Known methods as disclosed in Patent Documents 10 and 11 for example can be used to use the phosphor of the present invention to manufacture an LED illuminator. In this case, the light-emitting light source is preferably an ultraviolet LED or a blue LED having a wavelength in a range from 350 to 500 nm. The light-emitting elements thereof may be a nitride semiconductor such as GaN or InGaN. The composition may be adjusted to provide a light-emitting light source having a predetermined wavelength.

In the illuminator apparatus, the phosphor of the present invention may be individually used or also may be combined with light-emitting light source having another light emission characteristic to provide an illuminator emitting a desired color.

Next, sialon phosphor according to the second embodiment of the present invention will be described. In order to achieve the second objective of the present invention, the inventors have carried out various experimental examinations on nitride phosphor and oxynitride phosphor. As a result, the present inventors have found that the secondary particles having appropriate shape and particle size distribution can ensure a superior fluorescence characteristic and that a light emission-related element having a appropriate concentration distribution in particles shows a superior fluorescence characteristic, thereby reaching the present invention.

The second sialon phosphor of the present invention has an average circularity degree of 0.75 or more of particles constituting the phosphor. The particle size distribution of the phosphor is characterized in that a 50% diameter in the cumulative fraction of the volumetric basis (hereinafter referred to as $D_{50}$) $D_{50}$ is 5 to 30 μm and $D_{10}$ is 2.0 μm or more.

Particles of the sialon phosphor of the present invention have an average circularity degree of 0.75 or more, preferably 0.8 or more, and more preferably 0.85 or more. The term "average circularity degree" means an average value of the circularity degrees that is defined by (circle peripheral length equal to particle area)÷(particle peripheral length). The average circularity degree can be measured by a particle shape measurement apparatus such as a flow-type particle image analysis apparatus (FPIA-3000 made by Sysmex Corporation). The number of particles to be measured is desirably 500 or more in order to reduce the variation in measurement values so that an average value of the circularity degrees of the particles can be calculated. Particles to be measured have a size in a range from 0.5 to 100 μm of a diameter of an area circle.

The sialon phosphor of the present invention has the particle size distribution in which the 50% diameter ($D_{50}$) in the cumulative fraction of the volumetric basis is to 30 μm and is preferably 10 to 25 μm. The value $D_{50}$ equal to or higher than 5 μm prevents decrease in the light emission intensity of the sialon phosphor measured by a fluorescence spectrophotometer and also prevents a disadvantage where remarkably scattered light in a layer including phosphor in an assembled LED to cause a decreased efficiency at which light is taken out to cause a decreased LED luminous efficiency. The value $D_{50}$ equal to or lower than 30 μm provides a sufficiently-large light emission intensity measured by a fluorescence spectrophotometer to provide a sufficiently-large luminous efficiency of an LED using the phosphor, and also prevents a case where phosphor having an excessive diameter is mixed in resin for example and sinks in the resin to make it difficult to use the phosphor or to cause the variation in the chromaticity of the LED or an uneven color of an irradiated face.

Furthermore, the sialon phosphor of the present invention has a particle size distribution in which the 10% diameter ($D_{10}$) in the cumulative fraction of the volumetric basis is 2 μm or more, preferably 4.5 μm or more, and more preferably 7.0 μm or more. The value $D_{10}$ of 2 μm or less causes a decreased light emission intensity of phosphor measured by a fluorescence spectrophotometer although the reason is unclear. When phosphor having such a value is assembled in an LED, a great number of particles having a small diameter are caused in the vicinity of a visible light wavelength. Thus, light is strongly scattered in a layer including the resultant phosphor to decrease the LED luminous efficiency (efficiency at which light is taken out). These numeric values also have a relation with the refractive index of the phosphor. Thus, although an optimal numeric value is different depending on the material of the phosphor, α-type sialon and β-type sialon have different crystal structures but have substantially the same density and refractive index and thus can be defined by the same numeric value. Furthermore, α-type sialon and β-type sialon have a higher refractive index than those of conventionally widely used oxide and sulfide phosphor. Thus, these optimal numeric values in the particle size distribution in the sialon phosphor will be increased.

Methods for measuring a particle size distribution include a laser diffraction scattering method, a centrifugal sedimentation light transmission method, an X-ray transmission method, a light shielding method, and an electric sensing zone method for example. From among these methods, a laser diffraction scattering method was selected because this method provides superior reproducibility and can be operated with a relatively ease. As a pre-processing before the measurement of samples, a small amount of a sample is put into water in which dispersant such as sodium phosphate aqueous solution is dripped to apply ultrasonic waves to the water to disperse the sample.

The sialon phosphor of the present invention is characterized in that light emission-related elements included in the phosphor particles are structured so that the interior of particles has a low concentration and the outer periphery has a high concentration. Preferably, the outer periphery of phosphor particles has a concentration 1.2 times or more higher than the interior of the particles. The present inventors have experimentally confirmed that the control of the concentration of light emission-related elements in the phosphor as described above can improve the luminous efficiency of the LED in which the phosphor is assembled.

The above light emission-related elements included in the sialon phosphor generally denote a metal ion called as the luminescent center. In the case of sialon, sialon can include, as the luminescent center, many rare-earth element ions (e.g., Ce, Pr, Eu, Tb, Yb, and Er ions) and transition metal element ions (e.g., Mn ion) for example. In order to allow phosphor to absorb excitation light to emit fluorescence with a sufficient intensity, the phosphor must include these elements with a certain concentration or higher. However, an excessively-high concentration generally causes a concentration quenching to cause a decreased light emission intensity. Thus, the concentration of the light emission-related elements in the phosphor must be controlled to have an appropriate value. This concentration range is different depending on the phosphor.

The concentration of the light emission-related elements of the outer periphery and the interior of a phosphor particle can be measured in the manner as shown below. First, phosphor particles are embedded by epoxy resin to cut the particles by an argon ion beam cross section preparation apparatus. Then, the cutting surface is observed by an electron microscope to find the cut phosphor particle to subject elements at the cutting surface of the phosphor to a line analysis by an energy dispersion-type X-ray analysis (EDX) and a surface analysis by an electron probe micro analysis (EPMA). The count calculated by EDX and EPMA is proportional to the number of existing elements. Thus, when a ratio between counts is calculated for measurement results under the same analysis conditions, the ratio between the counts shows a ratio of concentrations. Thus, the ratio between the concentration of the interior and the concentration of the outer periphery can be measured.

It is noted that the interior of a sialon phosphor particle of the present invention is defined as shown below. In a cross section of a particles obtained in the manner as described above, the maximum value of the length of a particle from tangent line of the outer periphery of the particle in a vertical direction (hereinafter this value will be called as the maximum length of a particle in the vertical direction to the tangent line) is calculated. The interior of a sialon phosphor particle denotes an inner part of a 20%-inner line of the maximum value. The outer periphery denotes an outer part of the 20%-inner line. The status in which the concentration of a light emission-related element is low in the interior of a particle and is high in the outer periphery of the particle does not mean that the entire interior has a lower concentration than that of the outer periphery but means a particle cross section having a diameter close to $D_{50}$ is structured so that a size of about 1 μm in the interior of the particle has an average concentration that is lower than that of a size of about 1 μm in the outer periphery of the particle.

The line analysis may be performed by comparing average line analysis values of lengths of about 1 μm. The surface analysis may be performed by calculating an average of analysis values for a 1 μm square. Measurement may be performed for a part in a particle having the lowest concentration and a part of the outer periphery having the highest concentration to measure the concentrations to calculate a proportion. Preferably, the concentration ratio is 1.2 or more. A concentration ratio lower than 1.2 causes a smaller concentration difference to reduce a difference between the light emission at the outer periphery and the light emission at the interior, which may prevent the present invention from being sufficiently effective. The reason why the effect of the present invention may be due to the followings.

When the light emission intensity of the phosphor is measured by a fluorescence spectrophotometer, an increase in the diameter tends to cause a higher light emission intensity. However, when an LED is actually assembled to measure the luminous efficiency, the use of the phosphor having a large diameter may cause a decreased luminous efficiency. This difference may be presumably due to the following reason. Specifically, in the case of a measurement using a fluorescence spectrophotometer, a direction along which the excitation light enters and a direction along which fluorescence is measured are at the same side of a measurement cell filled with the phosphor. However, in the case of an LED, light transmitted through a layer in which the phosphor is dispersed is measured. Phosphor having a large diameter tends to absorb light without transmitting light therethrough. In the case of the secondary particles in which the primary particles are aggregated in particular, the interface in the secondary particle tends to cause light scattering and absorption. Thus, even when light is emitted in the secondary particle, the light is difficultly taken out from the phosphor particle, which may cause a deteriorated LED luminous efficiency.

In order to avoid this, interfaces in the secondary particle causing the light scattering and absorption are minimized. Specifically, it is presumably important to reduce the number of the primary particles constituting the secondary particles and to minimize crystal phase and foreign matters other than sialon in the secondary particles. It is also considered that the light emitted in the vicinity of the surface of the secondary particle can be easily taken out from the phosphor to reduce an excessive absorption of light in the secondary particle.

As in the present invention, in the case a light emission-related element at the outer periphery of a particle of the phosphor has a high concentration and the interior of the particle has a low concentration, the concentration of the light emission-related element at the outer periphery may be suppressed so as to prevent the concentration quenching. This presumably allows the absorption and emission of excitation light in the outer periphery to be stronger than those in the interior and thus the light can be easily taken out from the phosphor particles to the outer side, thus achieving the above objective.

The α-type sialon is known as being represented by a general expression: $(M1)_X(M2)_Y(Si)_{12-(m+n)}(Al)_{m+n}(O)_n(N)_{16-n}$ [wherein M1 is one or more types of elements selected from a group consisting of Li, Mg, Ca, Y, and lanthanide metal (whreas except for La and Ce) and M2 is one or more types of elements selected from Ce, Pr, Eu, Tb, Yb, and Er). In the present invention, α-type sialon is selected in particular that has a relation in which 0.3≤X+Y≤1.5, 0<Y≤0.7, 0.6≤m≤3.0, 0≤n≤2.5, and X+Y=m/(average valence of M1 and M2].

Since M1 may be monovalent to trivalent and M2 may be divalent to tetravalent, the above average valence is calculated based on the valences and contents of the respective elements. For example, 60% of M1 is $Li^+$, 40% of M1 is $Ca^{2+}$, M2 is $Ce^{3+}$, X is 0.8, and Y is 0.2 for example, the average valence is 1.72. It is preferable that the lower limit of Y to X+Y is 0.01 or more and preferably 0.02 or more and the upper limit of Y to X+Y is 0.5 or less and preferably 0.3 or less. Y exceeding the upper limit causes a so-called concentration quenching to cause a decreased light emission intensity of the phosphor and also causes an increased cost because M2 generally requires a high cost.

According to a preferred embodiment of the present invention, the M1 is Ca and M2 is Eu. In this case, the resultant phosphor absorbs light in a range from visible light to ultraviolet light, shows light emission having a peak in a range from 565 to 610 nm, has a high luminous efficiency, shows a small change in the light emission intensity and light emission wavelength due to the operating temperature, and has high moisture resistance reliability and high temperature durability. This is preferably used as white LED phosphor using blue to ultraviolet LED.

The present invention is sialon phosphor that is composed of host material of β-type sialon represented by a general expression of $Si_{6-z}Al_zO_zN_{8-z}$ [wherein 0.01≤z≤4.2] and that includes 0.01 to 10 atm % of a metal element M3 [wherein M3 is one or more types elements selected from among Mn, Ce, and Eu]. This range provides a high light emission intensity. Preferably, 0.1≤z≤0.5 is established, M3 is Eu, and the content is 0.03 to 0.3 atm %. More preferably, 0.2≤z≤0.4 is established and the Eu content is 0.05 to 0.25 atm %.

The present invention is a method of manufacturing sialon phosphor characterized in that silicon-containing material, aluminum-containing material, and optionally raw material including M1, M2, and M3 are mixed to prepare granulated powders to heat the powders in a nitrogen gas atmosphere at 1500 to 2100 degrees C. The inventors have reached the present invention by obtaining a finding according to which granulated powders of raw material subjected to an appropriate processing can allow the shape of the secondary particle after a burning reaction to reflect the shape of the granulated powders.

Silicon-containing material is generally silicon nitride powders. However, silicon-containing material may be partially substituted with silicon oxide, zeolite, polysilazane, metal silicon, or the like or two or more of them also may be mixed. Aluminum-containing material may be, in addition to aluminum nitride, aluminum oxide, aminoalan, iminoalan, metal aluminum or the like or two or more of them also may be mixed. M1-containing material, M2-containing material, and M3-containing material may be nitride, oxide, carbonate, nitrate, oxalate, fluoride, carbide, hydroxide, metal, or the like of M1, M2, and M3 or two or more of them also may be mixed.

Granulated powders may be prepared by various methods. Especially, the use of a spray dryer in particular can provide the formation of granulated powders having an appropriate particle size. Granulated powders are prepared by a spray dryer in the manner as described below. First, a ball mill pot accommodating therein balls is prepared. In the pot, solvent such as ethanol, raw material, and a small amount of binder, and optionally dispersed material or the like subjected to a weighting are placed in a predetermined amount and are mixed to prepare slurry. The spray dryer is pre-heated by blowing hot air thereinto. The slurry is supplied to a spray nozzle provided at the upper part of this spray dryer to collect granulated powders by cyclone provided at the downstream of hot air.

The ball mill pot is preferably made of material such as polyamide resin that causes a small influence even when the material wears to cause contamination. Ball can be made from silicon nitride or high-purity alumina, which consists of metal constituting sialon (e.g., silicon, aluminum). Binder may be polyvinyl alcohol, polyvinyl butyral, polyacrylic acid, methylcellulose, or the like. Solvent may be, in addition to ethanol, methanol, isopropanol, acetone, or the like. A small amount of butanol, toluene, xylene, or the like also may be mixed in binder in order to adjust the binder solubility and the slurry property. Alternatively, when slurry can be prepared by mixing water-soluble binder for a short time, water also can be used as solvent. However, attention is required when raw material that is easily hydrolyzed (e.g., aluminum nitride powders) because such material may be hydrolyzed when being immersed in water for a long time or when a water temperature is high. Alternatively, easily-hydrolyzed powders used as raw material also can be subjected to a known surface processing method in order to increase the time during which the water-base slurry can be used.

Since the shape of a granulated powder has an influence on the shape of the secondary particle of the phosphor obtained by the subsequent burning, the shape of a granulated powder, the sphericity, hence the particle size distribution, the hardness of granulated powders, or the like must be made to have an appropriate value. The shape and the diameter of a granulated powder can be controlled by the compounding of raw material, the type of a nozzle for spraying slurry (e.g., a fluid nozzle of a spray dryer, a rotation nozzle), the fluid flow rate, the slurry supply amount, the temperature of a heat air inlet, or the like. Conditions for manufacturing granulated powders must be examined in advance in order to prevent the resultant granulated powders from being hollow or broken. In order to allow the phosphor subjected to a burning process to have an average diameter in a range from 5 to 30 µm, the conditions may be selected in the present invention so that granulated powders can have a diameter in a range from about 10 to about 35 µm. A narrower particle size distribution width of granulated powders also can provide the resultant sialon phosphor with a superior characteristic.

The resultant granulated powders are placed into a crucible that is structured so that a surface having a contact with the granulated powders is made of boron nitride, silicon nitride, aluminum nitride, or the composite material thereof to carry out debindering. A debindering temperature is about 600 degrees C. or less. A heating apparatus such as a resistance heating furnace or a gas furnace may be appropriately selected. A debindering atmosphere may be appropriately selected from among nitrogen, air, combustion gas, or vacuum for example. Since there may be a case where gas temporarily generated in the debindering may break granulated powders, a temperature rising profile or a vacuum degree must be adjusted to prevent granulated powders from being broken. In the case, raw material is made of material that generates gas during a temperature rising by a heating process (e.g., carbonate, hydroxide, nitrate, or fluoride), the temperature rising speed and the vacuum degree must be controlled so as to prevent the breakage of the granulated powders due to the generated gas.

A burning furnace for synthesizing sialon may be selected depending on burning temperature conditions. The burning furnaces may include an atmosphere control electric furnace using alumina fibers as insulating material, a graphite heater heating electric furnace using carbon insulating material or the like. The debindering process also may be performed in the same furnace. Sialon is synthesized by being burned at 1500 to 2100 degrees C. The α-type sialon is synthesized at 1500 to 1850 degrees C. and preferably at 1600 to 1800 degrees C. The β-type sialon is synthesized at 1800 to 2100 degrees C. and preferably at 1900 to 2050 degrees C. Synthesization at a temperature lower than this temperature range forms the respective sialons but prevents the luminescent center element to be sufficiently solid-soluted into the sialon crystal, thus causing a decreased light emission intensity. Synthesization at a temperature exceeding this temperature range on the other hand may cause a decreased light emission intensity due to an unknown reason. The burning time may be appropriately selected from a range from 4 to 36 hours. When a synthesis reaction is performed at 1800 degrees C. or more, a nitrogen gas pressure in the atmosphere is set to be higher than the decomposition pressure of silicon nitride to prevent the generation of silicon metal.

The granulated powders of raw material powders formed and burned in the manner as described above can improve the circularity degree of the resultant phosphor particles to control the average diameter and the particle size distribution. This can improve the luminous efficiency of the phosphor and the luminous efficiency of an LED using the phosphor. By adjusting the conditions for forming and burning granulated powders, a distribution of light emission-related elements can be provided in the interior and the outer periphery of a particle of the resultant sialon phosphor. When the outer periphery has a higher concentration than that of the interior, the phosphor and an LED using the phosphor can have an improved luminous efficiency.

The present invention is, also, a method of manufacturing sialon phosphor to add previously-synthesized sialon powders to raw material powders to mix the powders. According to this method, the added phosphor particles can be grown to have a larger size and phosphor particles can be formed so that light emission-related elements at the outer periphery of phosphor particles have a low concentration in the interior of particles and a high concentration at the outer periphery of the particles. Thus, the phosphor can have a higher light emission intensity and an LED using the phosphor can have a higher luminous efficiency.

The added sialon powders are preferably powders having a high circularity degree, e.g., 0.75 or more, can allow sialon crystal to grow at the outer circumference, thus providing particles having a high circularity degree and a further larger size. This provides the secondary particles composed of a less number of the primary particles. This can reduce an unnecessary scattering or absorption of light in the phosphor particles to improve the light emission intensity of the phosphor, thereby improving a luminous efficiency of an LED using the phosphor.

Sialon powders added to raw material are composed of α-type sialon to synthesize α-type sialon or are composed of β-type sialon to synthesize β-type sialon. However, other sialons and other nitrides or oxynitrides also may be included in the powders in an amount of 10 mass % or less. The content higher than 10 mass % may deteriorate the fluorescence characteristic. Since the content equal to or lower than 10 mass % can provide the α-type sialon single-phase by the synthesis reaction process, and thus is preferred. The additive amount is preferably 5 to 50 mass % to the total amount of raw material powders of 100 mass %. The additive amount of 5% or more can improve the light emission intensity and the additive amount of 50% or less can provide superior productivity. Preferably, the additive amount is 10 to 40 mass %. In the case, the concentration of the light emission-related elements of the added sialon powders (specifically M2 and M3) is lower than the concentration expected based on the compounding of the other raw materials, sialon powders can be synthesized structured so that the concentration of the outer periphery is higher than that of the interior, which is convenient.

By appropriately selecting the conditions of the respective steps of the manufacture method of the present invention, sialon phosphor having a high light emission intensity may be obtained by merely taking out the phosphor from a heating furnace after the respective steps. However, phosphor within the range of the present invention also can be obtained by optionally performing appropriate deagglomeration, grinding, and classification. The grinding step may be carried out by general grinding machines such as a ball mill, a stone mill, or a jet mill. However, an excessive grinding results in a great amount of powders having a minute diameter and thus is not preferred. An appropriate grinding can adjust the shape of the phosphor particles and can improve the circularity degree but may require a step to remove the resultant finely-divided powders. The classification may be performed by general classification machines such as pneumatic classification, elutriation classification, or a sieving for example. However, finely-divided powders are suitably removed by the pneumatic classification and the elutriation classification.

The present invention is also a light-emitting element characterized in including the above sialon phosphor and an LED having the maximum intensity in the light emission wavelength of 240 to 480 nm as constituting elements. As described above, the phosphor of the present invention itself has a high luminous efficiency and also can allow an LED using the phosphor to have a higher luminous efficiency (efficiency at which light is taken out). Thus, the LED of the present invention shows a high luminous efficiency.

The sialon phosphor of the present invention also may have a surface on which a transparent film having a antireflection function is formed. Alternatively, the sialon phosphor also can be processed by silane coupling agent to improve the adhesion between resin used for the assembly of the LED and the phosphor to promote the dispersion of the phosphor in the resin to consequently improve the LED characteristic.

PRACTICAL EXAMPLES

Next, the present invention will be described in further detail based on practical examples and comparison examples. First, practical examples of sialon phosphor according to the first embodiment of the present invention and the manufacture method thereof will be described.

Practical Examples 1 to 3

Comparison Examples 1 to 2

Synthesis of α-type sialon powders included in raw material powders (hereinafter referred to as α-core powders):

Raw material powders was prepared by a compounding composition composed of: silicon nitride powders of 75.4 mass %; aluminum nitride powders of 14 mass %; calcium carbonate powders of 5.5 mass %; calcium fluoride powders of 4.3 mass %; and europium oxide powders of 0.8 mass %. The raw material powders are put in ethanol solvent to subject the resultant slurry to a wet ball mill mixing by a silicon nitride-made pot and balls for 3 hours to filter and dry the slurry, thereby obtaining mixed powders.

Next, mixed powders are passed through a 75 μm-mesh sieve to fill the powders into a boron nitride-made crucible (made by DENKI KAGAKU KOGYO, grade N1). Then, the powders are subjected to a heating processing at a 1700 degrees C. for 5 hours in atmospheric pressure nitrogen in an electric furnace of a carbon heater. The resultant product was slightly deagglomerated and passed through a 45 μm-mesh sieve to obtain α-core powders A.

A part of the α-core powders A was further put in ethanol solvent and the solvent was subjected to a wet ball mill grinding by a silicon nitride-made pot and balls for 24 hours to filter and dry the slurry, thereby obtaining α-core powders B.

The specific surface area of the α-type sialon powders and the α-type sialon fine powders was measured by a constant volume-type gas adsorption method by a specific surface area measurement apparatus made by a BEL Japan, Inc. (BEL-SORP-mini) and was calculated by a BET multipoint analysis. It is noted that samples are subjected to a deaeration processing in the flow at an atmospheric pressure N2 at 305 degrees C. for 2 hours or more to subsequently measure the specific surface area. Adsorbate was made of N2 and had a molecular cross-sectional area of $16.2 \times 10^{-20}$ m$^2$. The resultant specific surface area thus obtained was 0.70 m$^2$/g for the α-core powder A and 3.9 m$^2$/g for the α-core powder B.

Synthesis of α-type Sialon Phosphor:

As shown in Table 1, raw material powders were obtained by blending the α-core powders A or the α-core powders B, silicon nitride powders, aluminum nitride powders, calcium carbonate powders, and europium oxide powders so that the α-type sialon single-phase can be obtained after the synthesis.

TABLE 1

| | | | Mixing composition (mass %) | | | |
|---|---|---|---|---|---|---|
| | α core powders | α core powders | $Si_3N_4$ | AlN | $CaCO_3$ | $Eu_2O_3$ |
| practical example 1 | A | 5.0 | 70.8 | 13.2 | 10.2 | 0.8 |
| practical example 2 | A | 15.0 | 63.3 | 11.8 | 9.2 | 0.7 |
| practical example 3 | A | 40.0 | 29.8 | 5.5 | 4.3 | 0.3 |
| Comparison Example 1 | N/A | 0 | 74.5 | 13.9 | 10.8 | 0.8 |
| Comparison Example 2 | B | 15.0 | 63.3 | 11.8 | 9.2 | 0.7 |

As shown in Table 1, the mixing composition (mass %) of the raw material powders of Practical example 1 was composed of α-core powders A of 5.0%, $Si_3N_4$ of 70.8%, AlN of 13.2%, $CaCO_3$ of 10.2%, and $Eu_2O_3$ of 0.8%. The mixing composition of the raw material powders of Practical example 2 was composed of α-core powders A of 15.0%, $Si_3N_4$ of 63.8%, AlN of 11.8%, $CaCO_3$ of 9.2%, and $Eu_2O_3$ of 0.7%. The mixing composition of the raw material powders of Practical example 3 was composed of α-core powders A of 40%, $Si_3N_4$ of 29.8%, AlN of 5.5%, $CaCO_3$ of 4.3%, and $Eu_2O_3$ of 0.3%.

The mixing composition of the raw material powders of Comparison Example 1 was not added with α-core powders and was composed of $Si_3N_4$ of 74.5%, AlN of 13.9%, $CaCO_3$ of 10.8%, and $Eu_2O_3$ of 0.87%. The mixing composition of the raw material powders of Comparison Example 2 was composed of α-core powders B of 15.0%, $Si_3N_4$ of 63.3%, AlN of 11.8%, $CaCO_3$ of 9.2%, and $Eu_2O_3$ of 0.7%.

The compounded raw material powders were put in solvent of ethanol and the solvent was subjected to a wet ball mill mixing by a plastic-made pot and silicon nitride-made balls. Then, the solvent was removed by a rotary evaporator to pass the powders through a 75 μm-mesh sieve to obtain mixed powders.

About 20 g of the mixed powders was filled in a boron nitride-made crucible (made by DENKI KAGAKU KOGYO, grade NB1000, density of 1.5 $g/cm^3$, thickness of 5 mm) having an inner diameter 60 mm and a height of 35 mm. Then, this crucible was covered by a lid made of the same material. Then, the crucible was put in an electric furnace of a carbon heater and was subjected to a heating processing in pressurization nitrogen atmosphere at 0.45 MPa at 1750 degrees C. for 12 hours. The resultant sample was not subjected to a grind processing or the like and was subjected to a sieving to finally obtain powders passed through a 45 μm-mesh sieve as the final product. In the above process, as an index showing the easy pulverizability of the synthesized product, a value (sieve passage rate) obtained by dividing the mass of the final product by the total mass subjected to the sieveing processing was calculated.

The phosphor powders were evaluated in the manner as described below. The specific surface area was measured by the above-mentioned method. A powder X-ray diffraction measurement using CuKa radiation was used to investigate the crystal phase existing in synthesis powders. Si powders were used as an internal reference to carry out the lattice constant measurement based on JIS K0131 to calculate the lattice constant a and the lattice constant c of the α-type sialon hexagonal crystal. With regards to the fluorescence characteristic, a spectrophotofluorometer (F4500 made by Hitachi High Technologies Incorporation) calibrated by the rhodamine B method and the standard light source was used to measure a fluorescence spectra in 455 nm excitation light to calculate a peak wavelength, a peak intensity, and luminance. The peak intensity and luminance are both shown as relative values to values assumed as 100 in Practical example 1. Based on the fluorescence spectra, CIE1931 chromaticity coordinate values (x, y) were calculated. The evaluation results are shown in Table 2 and Table 3.

TABLE 2

|  | Sieve passage rate (%) | Specific surface area ($m^2/g$) | X-ray diffraction Crystal phase | Lattice constant a (nm) | Lattice constant c (nm) |
|---|---|---|---|---|---|
| practical example 1 | 65 | 0.47 | Only α-type sialon | 0.7838 | 0.5691 |
| practical example 2 | 70 | 0.31 | Only α-type sialon | 0.7838 | 0.5697 |
| practical example 3 | 60 | 0.36 | Only α-type sialon | 0.7835 | 0.5695 |
| Comparison Example 1 | 35 | 0.72 | Only α-type sialon | 0.7836 | 0.5697 |
| Comparison Example 2 | 50 | 0.61 | Only α-type sialon | 0.7835 | 0.5695 |

As shown in Table 2, the phosphor powders of Practical examples 1 to 3 show sieve passage rates of 65%, 70%, and 60%, respectively. The phosphor powders of Comparison Examples 1 and 2 show sieve passage rates of 35% and 50%, respectively.

Practical examples 1 to 3 show the specific surface areas of 0.47 $m^2/g$, 0.31 $m^2/g$, and 0.36 $m^2/g$, respectively. Comparison Examples 1 and 2 show the specific surface areas of 0.72 $m^2/g$ and 0.61 $m^2/g$, respectively.

The result of X-ray diffraction showed that the crystal phases of Practical examples 1 to 3 and Comparison Examples 1 and 2 were all α-type sialon. Practical examples 1 to 3 showed the lattice constants a of 0.7838 nm, 0.7838 nm, and 0.7835 nm, respectively. In the case of Comparison Examples 1 and 2, the lattice constants a were 0.7836 nm and 0.7835 nm, respectively. Practical examples 1 to 3 showed the lattice constants c of 0.5691 nm, 0.5697 nm, and 0.5695 nm, respectively. In the case of Comparison Examples 1 and 2, the lattice constants c were 0.5697 nm and 0.5695 nm, respectively.

As shown in Table 3, the fluorescence spectra obtained by the phosphors of Practical examples 1 to 3 show the peak wavelengths of 585 nm, 588 nm, and 589 nm, respectively. In the case of Comparison Examples 1 and 2, the peak wavelengths were all 587 nm. The fluorescence spectra obtained by the phosphors of Practical examples 1 to 3 have the relative peak intensities of 100%, 118%, and 110%, respectively. In the case of Comparison Examples 1 and 2, the relative peak intensities were 85% and 95%, respectively. The fluorescence spectra obtained by the phosphors of Practical examples 1 to 3 have the relative luminances of 100%, 116%, and 107%, respectively. In the case of Comparison Examples 1 and 2, the relative luminances were 85% and 95%, respectively. The fluorescence spectra obtained by the phosphors of Practical examples 1 to 3 have the chromaticity coordinate values (x, y) of (0.518, 0.474), (0.524, 0.469), and (0.525, 0.468), respectively. In the case of Comparison Examples 1 and 2, the chromaticity coordinate values were (0.517, 0.475) and (0.519, 0.473), respectively.

|  | Peak wavelength (nm) | Relative peak intensity (%) | Relative luminance | Chromaticity coordinate values | |
|---|---|---|---|---|---|
|  |  |  |  | x | Y |
| practical example 1 | 585 | 100 | 100 | 0.518 | 0.474 |
| practical example 2 | 588 | 118 | 116 | 0.524 | 0.469 |
| practical example 3 | 589 | 110 | 107 | 0.525 | 0.468 |
| Comparison Example 1 | 587 | 85 | 85 | 0.517 | 0.475 |
| Comparison Example 2 | 587 | 95 | 95 | 0.519 | 0.473 |

Comparison Example 3

The synthesis was performed based on the same conditions as those of Practical example 1 except for that the heating processing temperature was 1500 degrees C. The sieve passage rate was 90% and the specific surface area was 1.20 $m^2/g$. The result of X-ray diffraction showed that unreacted α-$Si_3N_4$ and AlN existed as the secondary crystal phase. A ratio of the highest peak intensity of the α-$Si_3N_4$ and AlN to the diffraction line intensity of the face (102) of the α-type sialon was 32% and 6%, respectively. The peak wavelength of the fluorescence spectrum in the 455 nm excitation of this phosphor was 576 nm and the relative peak intensity showed a low value of 38%.

Practical Examples 4 and 5

In Practical example 4, a BN crucible was changed from the one having a density of 1.5 g/cm$^3$ of Comparison Example 1 to the one having a density of 1.75 g/cm$^2$ (made by DENKI KAGAKU KOGYO, grade N-1). In Practical example 5, the crucible in Comparison Example 1 was changed to the one having a density of 2.17 g/cm$^2$ (made by Shin-Etsu Chemical Co., Ltd., α-BN). The synthesis was performed and the evaluation result is shown in Table 4 and Table 5.

As shown in Table 4, the phosphor powders of Practical examples 4 and 5 showed sieve passage rates of 38% and 34%, respectively. The specific surface areas of Practical examples 4 and 5 were 0.47 m$^2$/g and 0.42 m$^2$/g, respectively. The X-ray diffraction showed that all of the crystal phases of Practical examples 4 and 5 showed α-type sialon only. The lattice constants a of Practical examples 4 and 5 were 0.7839 nm and 0.7838 nm, respectively. The lattice constants c were 0.5690 nm and 0.5688 nm, respectively.

TABLE 4

| | Sieve passage rate (%) | Specific surface area (m$^2$/g) | Crystal phase | X-ray diffraction | |
| --- | --- | --- | --- | --- | --- |
| | | | | Lattice constant a (nm) | Lattice constant c (nm) |
| practical example 4 | 38 | 0.47 | Only α-type sialon | 0.7839 | 0.5690 |
| practical example 5 | 34 | 0.42 | Only α-type sialon | 0.7838 | 0.5688 |

As shown in Table 5, the fluorescence spectrums obtained by the phosphors of Practical examples 4 and 5 showed peak wavelengths of 585 nm and 584 nm, respectively. The fluorescence spectrums obtained by the phosphors of Practical examples 4 and 5 showed relative peak intensities of 101% and 108%, respectively. The fluorescence spectrums obtained by the phosphors of Practical examples 1 to 3 showed the relative luminances of 100% and 108%, respectively. The fluorescence spectrums obtained by the phosphors of Practical examples 4 and 5 showed the chromaticity coordinate values (x, y) of (0.518, 0.474) and (0.517, 0.475), respectively.

TABLE 5

| | Peak wavelength (nm) | Relative peak intensity (%) | Relative luminance | Chromaticity coordinate values | |
| --- | --- | --- | --- | --- | --- |
| | | | | x | Y |
| practical example 4 | 585 | 101 | 100 | 0.518 | 0.474 |
| practical example 5 | 584 | 108 | 108 | 0.517 | 0.475 |

Even when the material of the BN crucible was changed, no change was caused in the sintering degree of the synthesized products. Although the sieve passage rates are low, the use of a BN crucible having a high density provides an increased diameter of the primary particle and a reduced specific surface area. As a result, the light emission characteristic was improved compared with the one of Comparison Example 1.

Next, the following section explains an practical example regarding sialon phosphor and the manufacture method thereof according to the second embodiment of the present invention as well as a light-emitting element using the sialon phosphor.

Practical Example 6

Raw material powders of compounding composition were obtained by silicon nitride powders (made by UBE INDUSTRIES, LTD. E10) of 150 parts by mass, aluminum nitride powders (made by Tokuyama, grade F) of 28 parts by mass, europium oxide powders (made by Shin-Etsu Chemical Co., Ltd., grade RU) of 1.6 parts by mass, and calcium fluoride powders (made by Wako Pure Chemical Industries, Ltd.) of 13 parts by mass.

Next, the above raw material powders and ethanol of 470 ml, silicon nitride-made balls of 1.4 kg, and butyral (made by DENKI KAGAKU, 3000K) of 10 g were placed in a nylon pot having an inner volume of 2 l to perform a wet ball mill mixing for 4 hours. The resultant slurry was sprayed by a spray dryer (made by Fujisaki Denki, micro mist dryer MDL-050B) to prepare granulated powders. The observation of the granulated powders by an electron microscope showed that the particle diameters were in a range from 10 to 30 μm. The granulated powders of 20 g were placed in a boron nitride-made crucible (made by DENKI KAGAKU KOGYO, N1) having an inner volume of 100 ml to carry out debindering in air at 600 degrees C. to subsequently subject the powders to a heating processing in nitrogen atmosphere of atmospheric pressure in an electric furnace of a carbon heater at 1700 degrees C. for 12 hours. The resultant product was slightly deagglomerated in an agate mortar to pass the product through a 45 μm-mesh sieve, thereby obtaining the α-type sialon phosphor powders.

Through an X-ray diffraction apparatus, the resultant powders were confirmed to have the single-phase α-type sialon. An average circularity degree of the powders was checked by a flow-type particle image measurement apparatus made by Sysmex Corporation (FPIA3000). The measurement samples were adjusted by adding to-be-measured powders to water for which the viscosity is adjusted by adding propylene glycol to disperse the powders by ultrasonic waves. Among the data for the measured circularity degrees, an average value of 500 or more pieces of data in a range from 0.5 to 100 μm of diameters of area circles was calculated. The particle size distribution of the resultant powders was measured by a laser diffraction scattering method (using a "LS-230-type" particle size distribution measurement apparatus made by COULTER). It is noted that samples for measuring the particle size distribution were prepared based on measurement conditions of silicon nitride described in the attached explanation table 1 of JIS R 1629-1997.

The concentrations of light emission-related elements in a particle were calculated in the manner as described below. The resultant phosphor powders were embedded in epoxy resin and were cut by a cross section polisher made by JEOL (SM-9010) to prepare samples for the observation of particle cross sections by an electron microscope. An electron probe microanalyzer made by JEOL (JXA-8200) was used to map light emission-related elements at a particle cross section (Eu in this case). Particles for which an element mapping is performed were appropriately selected by selecting particles having a diameter close to a previously-measured average particle diameter. The maximum length of observed particles in a direction vertical to the tangent line was measured. At 20% inner side of the maximum length in the vertical direction to the tangent line from the outer circumference of a particle, a boundary line between the interior and the outer periphery of the particle was assumed. Then, a 1 μm square part in the interior having the lowest average concentration was searched and a 1 μm square part in the outer periphery having the highest average concentration was searched. A fluorescence spectrophotometer made by Hitachi High Technologies Incorporation (F4500) was used to measure the fluorescence spectrum in the blue light excitation (wavelength 455 nm) to calculate the peak intensity of the spectrum (light emission intensity). It is noted that the peak intensity changes depending on the measurement apparatus or conditions and thus practical examples and comparison examples measured under the same conditions were compared to one another. Values of X, Y, m, and n were calculated based on quantity analysis values of constituting metal components.

Table 6 shows the values calculated in the manner as described above. As shown in Table 6, the α-type sialon phosphor of Practical example 6 showed the compositions X, Y, m, and n of 0.87, 0.034, 1.80, and 0.23 respectively. The α-type sialon phosphor showed an average circularity degree of 0.86. The particle size distribution showed $D_{50}$ and $D_{10}$ of 11.6 μm and 4.2 μm, respectively. Eu that was M2 metal added to the α-type sialon phosphor showed inner and outer concentrations of 4 and 8, respectively. The fluorescence spectrum showed the light emission peak intensity of 118.

synthesized in Practical example 7 showed an average circularity degree of 0.79 and the particle size distributions $D_{50}$ and $D_{10}$ were 11.0 μm and 4.2 μm, respectively. Eu that was M2 metal added to the α-type sialon phosphor showed inner and outer concentrations of 6 and 6, respectively. The fluorescence spectrum showed the light emission peak intensity of 110. As is clear from these values, the α-type sialon added to the raw material increases the light emission intensity of the phosphor.

The starting raw material of Practical example 8 included the above α-type sialon phosphor powders in an amount of 5 mass %. The α-type sialon phosphor synthesized in Practical example 8 showed an average circularity degree of 0.84. The particle size distributions $D_{50}$ and $D_{10}$ were 13.2 μm and 5.0 μm, respectively. Eu that was M2 metal added to the α-type sialon phosphor showed inner and outer concentrations of 6 and 7, respectively. The fluorescence spectrum showed the light emission peak intensity of 119.

The starting raw material of Practical example 9 included the above α-type sialon phosphor powders in an amount of 10 mass %. The α-type sialon phosphor synthesized in Practical example 9 showed an average circularity degree of 0.86. The particle size distributions $D_{50}$ and $D_{10}$ were 18.0 μm and 6.3 μm, respectively. Eu that was M2 metal added to the α-type sialon phosphor showed inner and outer concentrations of 5

TABLE 6

| | Addition amount of α sialon (mass %) | Average circularity degree | D50 μm | D10 μm | Inner M2 concentration a.u. | Outer M2 concentration a.u. | Light emission peak intensity a.u. | X | Y | m | n |
|---|---|---|---|---|---|---|---|---|---|---|---|
| practical example 6 | — | 0.86 | 11.6 | 4.2 | 4 | 8 | 118 | 0.87 | 0.034 | 1.80 | 0.23 |
| practical example 7 | 2 | 0.79 | 11.0 | 4.2 | 6 | 6 | 110 | | | | |
| practical example 8 | 5 | 0.84 | 13.2 | 5.0 | 6 | 7 | 119 | | | | |
| practical example 9 | 10 | 0.86 | 18.0 | 6.3 | 5 | 7 | 132 | 0.79 | 0.033 | 1.69 | 0.42 |
| practical example 10 | 20 | 0.91 | 19.0 | 8.2 | 4 | 8 | 137 | | | | |
| practical example 11 | 30 | 0.92 | 19.5 | 8.4 | 4 | 8 | 134 | 0.86 | 0.034 | 1.76 | 0.30 |
| practical example 12 | 40 | 0.92 | 17.5 | 7.5 | 4 | 9 | 130 | | | | |
| practical example 13 | 80 | 0.88 | 13.0 | 6.4 | 4 | 8 | 121 | | | | |
| Comparison Example 4 | — | 0.73 | 6.6 | 2.0 | 6 | 6 | 100 | 0.76 | 0.032 | 1.59 | 0.55 |

Practical Examples 7 to 13

Starting raw material powders of Practical examples 7 to 13 were made by the same raw material powders composition as Practical example 6 except for that calcium fluoride of Practical example 6 was substituted with oxidation calcium. To the raw material powders, the α-type sialon phosphor powders synthesized in Practical example 6 were added with a compounding ratio as shown in Table 6. The raw material powders were used to use the same method as that of Practical example 6 to synthesize the α-type sialon phosphors of Practical examples 7 to 13. Then, measurement values and calculation values as in Practical example 7 to 13 were calculated as same as the Practical example 6, and the results are shown in Table 6.

As shown in Table 6, the starting raw material of Practical example 7 included the above α-type sialon phosphor powders in an amount of 2 mass %. The α-type sialon phosphor and 7, respectively. The fluorescence spectrum showed the light emission peak intensity of 132.

The starting raw material of Practical example 10 included the above α-type sialon phosphor powders in an amount of 20 mass %. The α-type sialon phosphor synthesized in Practical example 10 showed an average circularity degree of 0.91. The particle size distributions $D_{50}$ and $D_{10}$ were 19.0 μm and 8.2 μm, respectively. Eu that was M2 metal added to the α-type sialon phosphor showed inner and outer concentrations of 4 and 8, respectively. The fluorescence spectrum showed the light emission peak intensity of 137.

The starting raw material of Practical example 11 included the above α-type sialon phosphor powders in an amount of 30 mass %. The α-type sialon phosphor synthesized in Practical example 11 showed an average circularity degree of 0.92. The particle size distributions $D_{50}$ and $D_{10}$ were 19.5 μm and 8.4 μm, respectively. Eu that was M2 metal added to the α-type sialon phosphor showed inner and outer concentrations of 4 and 8, respectively. The fluorescence spectrum showed the light emission peak intensity of 134.

The starting raw material of Practical example 12 included the above α-type sialon phosphor powders in an amount of 40 mass %. The α-type sialon phosphor synthesized in Practical example 12 showed an average circularity degree of 0.92. The particle size distributions $D_{50}$ and $D_{10}$ were 17.5 μm and 7.5 μm, respectively. Eu that was M2 metal added to the α-type sialon phosphor showed inner and outer concentrations of 4 and 9, respectively. The fluorescence spectrum showed the light emission peak intensity of 130.

The starting raw material of Practical example 13 included the above α-type sialon phosphor powders in an amount of 80 mass %. The α-type sialon phosphor synthesized in Practical example 13 showed an average circularity degree of 0.88. The particle size distributions $D_{50}$ and $D_{10}$ were 13.0 μm and 6.4 μm, respectively. Eu that was M2 metal added to the α-type sialon phosphor showed inner and outer concentrations of 4 and 8, respectively. The fluorescence spectrum showed the light emission peak intensity of 121.

Comparison Example 4

The α-type sialon phosphor was synthesized as in Practical example 6 except for the followings. Specifically, oxidation calcium was used instead of calcium fluoride. Silicon nitride-made balls and a pot were used. Ethanol was used as a medium to mix raw material powders for 60 minutes to filter and dry the powders. The resultant powders are placed in a boron nitride-made crucible to burn the powders without a debindering step.

The α-type sialon phosphor of Comparison Example 4 showed an average circularity degree of 0.73. The particle size distributions $D_{50}$ and $D_{10}$ were 6.6 μm and 2.0 μm, respectively. Eu that was M2 metal added to the α-type sialon phosphor showed inner and outer concentrations of 6 and 6, respectively. The fluorescence spectrum showed the light emission peak intensity of 100. This shows that the nonexistence of a granulation step causes a decreased average circularity degree to decrease the light emission intensity.

Practical Example 14

Sialon was synthesized as in Practical example 6 to obtain β-type sialon phosphor except for the followings. Specifically, silicon nitride (made by UBE INDUSTRIES, LTD., E10) of 191 part by weight, aluminum nitride (made by Tokuyama, grade F) of 6.8 part by weight, alumina (made by TAIMEI Chemicals, Co., Ltd., grade TM-DAR) of 0.2 part by weight, and europium oxide (made by Shin-Etsu Chemical Co., Ltd., grade RU) of 2.0 part by weight were weighted and the resultant sample was burned for 12 hours at 2000 degrees C. As in Practical example 6, the average circularity degree, the particle size distribution, the Eu concentration, the light emission intensity, and the composition were calculated. As shown in Table 7, the β-type sialon phosphor of Practical example 14 showed the composition Z of 0.27. The content of Eu as the M3 metal was 0.14 atm %. The β-type sialon phosphor showed an average circularity degree of 0.77. The particle size distributions $D_{50}$ and $D_{10}$ were 12.5 μm and 4.2 μm, respectively. Eu that was M3 metal added to the β-type sialon phosphor showed inner and outer concentrations of 6 and 8, respectively. The fluorescence spectrum showed the light emission peak intensity of 111.

TABLE 7

|  | β sialon additive amount (mass %) | Average circularity degree | D50 μm | D10 μm | Inner M3 concentration a.u. | Outer M3 concentration a.u. | Light emission peak intensity a.u. | Z | Eu at % |
|---|---|---|---|---|---|---|---|---|---|
| practical example 14 | — | 0.77 | 12.5 | 4.2 | 6 | 8 | 111 | 0.27 | 0.14 |
| practical example 15 | 2 | 0.78 | 13.2 | 4.8 | 7 | 8 | 114 |  |  |
| practical example 16 | 5 | 0.80 | 14.9 | 5.9 | 7 | 8 | 121 |  |  |
| practical example 17 | 10 | 0.84 | 17.1 | 7.6 | 6 | 8 | 129 | 0.27 | 0.14 |
| practical example 18 | 20 | 0.88 | 20.7 | 9.4 | 6 | 9 | 134 |  |  |
| practical example 19 | 30 | 0.90 | 22.0 | 9.8 | 6 | 8 | 130 | 0.27 | 0.14 |
| practical example 20 | 40 | 0.90 | 21.0 | 8.7 | 6 | 8 | 126 |  |  |
| practical example 21 | 80 | 0.82 | 14.0 | 6.4 | 6 | 8 | 118 |  |  |
| Comparison Example 5 | — | 0.69 | 8.5 | 1.4 | 7 | 8 | 100 | 0.27 | 0.14 |

Practical Examples 15 to 21

The β-type sialon phosphor powders of Practical examples 15 to 21 were synthesized except for that the raw material powders of Practical example 14 were further added with the β-type phosphor powders obtained in Practical example 14 with the compounding ratios shown in Table 7. As in Practical example 14, measurement values and calculation values were calculated, and shown in Table 7.

As shown in Table 7, the starting raw material of Practical example 15 included the above β-type sialon phosphor powders in an amount of 2 mass %. The β-type sialon phosphor synthesized in Practical example 15 showed an average circularity degree of 0.78. The particle size distributions $D_{50}$ and $D_{10}$ were 13.2 μm and 4.8 μm, respectively. Eu that was M3 metal added to the β-type sialon phosphor showed inner and outer concentrations of 7 and 8, respectively. The fluorescence spectrum showed the light emission peak intensity of 114.

The starting raw material of Practical example 16 included the above β-type sialon phosphor powders in an amount of 5 mass %. The β-type sialon phosphor synthesized in Practical example 16 showed an average circularity degree of 0.80. The particle size distributions $D_{50}$ and $D_{10}$ were 14.9 μm and 5.9 μm, respectively. Eu that was M3 metal added to the β-type sialon phosphor showed inner and outer concentrations of 7 and 8, respectively. The fluorescence spectrum showed the light emission peak intensity of 121.

The starting raw material of Practical example 17 included the above β-type sialon phosphor powders in an amount of 10 mass %. The β-type sialon phosphor synthesized in Practical example 17 showed the composition Z of 0.27. The content of Eu as M3 metal was 0.14 atm %. The α-type sialon phosphor showed an average circularity degree of 0.84. The particle size distributions $D_{50}$ and $D_{10}$ were 17.1 μm and 7.6 μm, respectively. Eu that was M3 metal added to the β-type sialon phosphor showed inner and outer concentrations of 6 and 8, respectively. The fluorescence spectrum showed the light emission peak intensity of 129.

The starting raw material of Practical example 18 included the above β-type sialon phosphor powders in an amount of 20 mass %. The β-type sialon phosphor synthesized in Practical example 18 showed an average circularity degree of 0.88. The particle size distributions $D_{50}$ and $D_{10}$ were 20.7 μm and 9.4 μm, respectively. Eu that was M3 metal added to the β-type sialon phosphor showed inner and outer concentrations of 6 and 9, respectively. The fluorescence spectrum showed the light emission peak intensity of 134.

The starting raw material of Practical example 19 included the above β-type sialon phosphor powders in an amount of 30 mass %. The composition Z was 0.27. The content of Eu as M3 metal was 0.14 atm %. The β-type sialon phosphor synthesized in Practical example 19 showed an average circularity degree of 0.90. The particle size distributions $D_{50}$ and $D_{10}$ were 22.0 μm and 9.8 μm, respectively. Eu that was M3 metal added to the β-type sialon phosphor showed inner and outer concentrations of 6 and 8, respectively. The fluorescence spectrum showed the light emission peak intensity of 130.

The starting raw material of Practical example 20 included the above β-type sialon phosphor powders in an amount of 40 mass %. The β-type sialon phosphor synthesized in Practical example 20 showed an average circularity degree of 0.90. The particle size distributions $D_{50}$ and $D_{10}$ were 21.0 μm and 8.7 μm, respectively. Eu that was M3 metal added to the β-type sialon phosphor showed inner and outer concentrations of 6 and 8, respectively. The fluorescence spectrum showed the light emission peak intensity of 126.

The starting raw material of Practical example 21 included the above β-type sialon phosphor powders in an amount of 80 mass %. The β-type sialon phosphor synthesized in Practical example 21 showed an average circularity degree of 0.82. The particle size distributions $D_{50}$ and $D_{10}$ were 14.0 μm and 6.4 μm, respectively. Eu that was M3 metal added to the β-type sialon phosphor showed inner and outer concentrations of 6 and 8, respectively. The fluorescence spectrum showed the light emission peak intensity of 118.

These values show that the addition of the β-type sialon to the raw material increases the light emission intensity of the phosphor.

Comparison Example 5

The β-type sialon phosphor of Comparison Example 5 was synthesized as in Practical example 14 except for that the raw material powders were mixed in a ball mill and the resultant powders were placed in a boron nitride-made crucible to burn the powders without a debindering step.

As shown in Table 7, the β-type sialon phosphor of Comparison Example 5 showed the composition Z of 0.27. The content of Eu as M3 metal was 0.14 atm %. The β-type sialon phosphor of Comparison Example 5 showed an average circularity degree of 0.69. The particle size distributions $D_{50}$ and $D_{10}$ were 8.5 μm and 1.4 μm, respectively. Eu that was M3 metal added to the β-type sialon phosphor showed inner and outer concentrations of 7 and 8, respectively. The fluorescence spectrum showed the light emission peak intensity of 100. This result shows that the nonexistence of the granulation step causes a decreased average circularity degree to cause a decreased light emission intensity.

Practical Examples 22 and 23 and Comparison Example 6

The respective phosphor powders obtained in Practical examples 6 and 10 as well as Comparison Example 4 were mixed with water of 100 g and epoxy-base silane coupling agent (made by Shin-Etsu Silicones, KBE402) of 1.0 g to agitate the solution for one night. Thereafter, the sialon phosphor processed by silane coupling agent that was filtered and kneaded in epoxy resin (made by SANYU REC Co., Ltd., NLD-SL-2101) of 5 g. Then, this kneaded matter was potted on a blue LED having a light emission wavelength of 460 nm previously electrically connected into a LED surface mount package. Then, the kneaded matter was subjected to a vacuum deaeration and was heated and cured at 120 degrees C., thereby manufacturing a surface-mount LED. Current of 20 mA was caused to flow in the surface-mount LED to measure the light emission spectrum of the generated light to calculate the luminous efficiency, which is shown in Table 8.

As shown in Table 8, the LEDs of Practical examples 22 and 23 and Comparison Example 6 showed luminous efficiencies of 41 lm/W, 51 lm/W, and 36 lm/W, respectively.

TABLE 8

| | Used phosphors | Luminous efficiency lm/W |
|---|---|---|
| practical example 22 | Practical example 6 | 41 |
| practical example 23 | Practical example 10 | 51 |
| Comparison Example 6 | Comparison Example 4 | 36 |

Practical Examples 24 and 25

Comparison Example 7

The phosphor powders obtained in Practical examples 14 and 18 as well as Comparison Example 5 were mixed with water of 100 g and epoxy-base silane coupling agent (made by Shin-Etsu Silicones, KBE402) of 1.0 g to agitate the solution for one night. Thereafter, the sialon phosphor processed by silane coupling agent that was filtered and kneaded in epoxy resin (made by SANYU REC Co., Ltd., NLD-SL-2101) of 5 g. Then, this kneaded matter was potted on a blue LED having a light emission wavelength of 460 nm previously electrically connected into a LED surface mount package. Then, the kneaded matter was subjected to a vacuum deaeration and was heated and cured at 120 degrees C., thereby manufacturing a surface-mount LED. Current of 20 mA was caused to flow in this surface-mount LED to measure the light emission spectrum of the generated light to calculate the luminous efficiency, which is shown in Table 9.

As shown in Table 9, the LEDs of Practical examples 24 and 25 and Comparison Example 7 showed luminous efficiencies of 40 lm/W, 49 lm/W, and 33 lm/W, respectively.

TABLE 9

|  | Used phosphors | Luminous efficiency lm/W |
|---|---|---|
| practical example 24 | Practical example 14 | 40 |
| practical example 25 | Practical example 18 | 49 |
| Comparison Example 7 | Comparison Example 5 | 33 |

INDUSTRIAL APPLICABILITY

According to the first α-type sialon powders and the manufacture method of the present invention, phosphor having a superior light emission characteristic can be manufactured with superior reproducibility and superior mass productivity. The α-type sialon phosphor of the present invention shows a light emission characteristic having a peak in a 540 to 600 nm region by the excitation light in a range from ultraviolet to blue light. Thus, the α-type sialon phosphor of the present invention is suitable for an illuminator having ultraviolet light or blue light as a light source (in particular, a white LED phosphor having ultraviolet LED or blue LED as a light emission light source) and is very industrially useful.

Since the illuminator of the present invention uses the phosphor, the lighting apparatus of the present invention has a superior light emission characteristic and a high energy efficiency and is very industrially useful.

The second sialon phosphor of the present invention has a remarkably-high fluorescence characteristic than the conventional product. Thus, the second sialon phosphor of the present invention can be used for various light-emitting applications such as LED. In particular, the second sialon phosphor of the present invention can be combined with an LED having the maximum intensity in the light emission wavelength of 240 to 480 nm to provide a white LED. Thus, the second sialon phosphor of the present invention can be used instead of conventionally-used fluorescence lamp and can be used for various applications.

Furthermore, according to the method of manufacturing the phosphor of the present invention, the phosphor having the above characteristics can be stably provided in a great amount and thus is very industrially useful.

What is claimed is:

1. A method of manufacturing sialon phosphor, comprising:
a step of mixing silicon-containing material, aluminum-containing material, and raw material including M1 (one or more types of elements selected from a group consisting of Li, Mg, Ca, Sr, Y, and lanthanide metal (except for La and Ce)), raw material including M2 (one or more types of elements selected from Ce, Pr, Eu, Tb, Yb, and Er), and previously-synthesized α-type sialon phosphor to prepare granulated powders; and
a step of heating the powders in a nitrogen gas atmosphere at 1500 to 2100 degrees C. to obtain α-type sialon phosphor,
said step of preparing granulated powder includes:
mixing said raw material, solvent, and a binder to prepare slurry,
recovering said slurry by a spray drier to make granulated powder, and
removing the binder from said recovered granulated powder.

2. A method of manufacturing sialon phosphor, comprising:
a step of mixing silicon-containing material, aluminum-containing material, raw material including M3 (one or more types of elements selected from a group consisting of Mn, Ce, and Eu) and previously-synthesized β-type sialon phosphor to prepare granulated powders; and
a step of heating the powders in a nitrogen gas atmosphere at 1500 to 2100 degrees C. to obtain β-type sialon phosphor,
said step of preparing granulated powder includes:
mixing said raw material, solvent, and a binder to prepare slurry,
recovering said slurry by a spray drier to make granulated powder, and
removing the binder from said recovered granulated powder.

3. The method of manufacturing sialon phosphor as set forth in claim 1, wherein the particle diameter of said granulated powder is 10 to 35 μm.

4. The method of manufacturing sialon phosphor as set forth in claim 2, wherein the particle diameter of said granulated powder is 10 to 35 μm.

* * * * *